(12) United States Patent
Pehlke et al.

(10) Patent No.: US 6,839,549 B2
(45) Date of Patent: *Jan. 4, 2005

(54) SYSTEM AND METHOD OF RF POWER AMPLIFICATION

(75) Inventors: David R. Pehlke, Chapel Hill, NC (US); Aristotle Hadjichristos, Apex, NC (US); William O. Camp, Jr., Chapel Hill, NC (US)

(73) Assignee: Ericsson Inc., Research Triangle Park, NC (US)

( * ) Notice: Subject to any disclaimer, the term of this patent is extended or adjusted under 35 U.S.C. 154(b) by 554 days.

This patent is subject to a terminal disclaimer.

(21) Appl. No.: 09/738,971

(22) Filed: Dec. 14, 2000

(65) Prior Publication Data

US 2002/0077066 A1 Jun. 20, 2002

(51) Int. Cl.[7] .................................................. H04B 1/04
(52) U.S. Cl. .............................. 455/127.1; 455/127.2; 455/115; 455/108; 455/116; 455/93
(58) Field of Search .......................... 455/93, 108, 116, 455/127, 115

(56) References Cited

U.S. PATENT DOCUMENTS

| | | | |
|---|---|---|---|
| 4,085,389 A | * | 4/1978 | Kuroda et al. .............. 332/159 |
| 4,247,948 A | * | 1/1981 | Okada et al. ............... 455/116 |
| 4,417,358 A | | 11/1983 | Zeis |
| 5,239,275 A | | 8/1993 | Leitch |
| 5,251,330 A | | 10/1993 | Chiba et al. |
| 5,777,519 A | | 7/1998 | Simopoulos |
| 5,825,248 A | | 10/1998 | Ozawa |
| 5,847,602 A | | 12/1998 | Su |
| 5,861,777 A | | 1/1999 | Sigmon et al. |
| 5,886,572 A | | 3/1999 | Myers et al. |
| 5,886,573 A | | 3/1999 | Kolanek |
| 5,898,342 A | | 4/1999 | Bell |
| 5,920,596 A | | 7/1999 | Pan et al. |
| 5,929,702 A | | 7/1999 | Myers et al. |
| 5,936,464 A | | 8/1999 | Grondahl |
| 5,942,938 A | | 8/1999 | Myers et al. |
| 5,966,051 A | * | 10/1999 | Griffith et al. .............. 330/285 |
| 6,049,703 A | | 4/2000 | Staudinger et al. |
| 6,356,154 B1 | * | 3/2002 | Hallen ........................ 330/254 |
| 2001/0014593 A1 | * | 8/2001 | McCune ...................... 455/127 |
| 2002/0137480 A1 | * | 9/2002 | Hadjichristos et al. ...... 455/127 |

FOREIGN PATENT DOCUMENTS

| | | |
|---|---|---|
| EP | 0473299 | 3/1992 |
| EP | 0516134 | 5/1992 |
| WO | WO 9534128 | 12/1995 |

* cited by examiner

*Primary Examiner*—Lee Nguyen
*Assistant Examiner*—Minh D Dao
(74) *Attorney, Agent, or Firm*—Coats & Bennett, P.L.L.C.

(57) ABSTRACT

A radio frequency power amplifier circuit provides linear amplitude modulation of a radio frequency output signal while operating in a saturated amplification mode. The power amplifier circuit incorporates a lossy modulator that functions as a variable resistance responsive to an amplitude modulation signal. A supply voltage is coupled to the voltage supply input of the power amplifier circuit through the lossy modulator, such that the supply voltage applied to the power amplifier varies with the amplitude modulation signal. The radio frequency power amplifier circuit modulates the envelope of an RF output signal generated by saturated mode amplification of a constant envelope radio frequency input signal.

33 Claims, 9 Drawing Sheets

SYSTEM AND METHOD OF RF POWER AMPLIFICATION

BACKGROUND OF THE INVENTION

The present invention generally relates to RF power amplifiers and, in particular, relates to efficient, linear RF signal amplification.

RF signal amplification represents a common step in the generation and transmission of RF signals. Typically, wireless communication devices, such as the mobile terminals used in a wireless communications network, include one or more power amplifiers that provide RF signal amplification. These power amplifiers boost the power level of the RF signal transmitted by the mobile terminals to a level appropriate for transmission to remote base stations and the like.

Mobile terminals usually have significant constraints on overall operating power. As the size of mobile terminals decreases in response to consumer demands for convenience and portability, so too does the size of included battery packs. Because the RF power amplification sections of mobile terminals represent a chief area of power consumption, efficient signal amplification is paramount to acceptable mobile terminal "talk-time" ratings. Such ratings express the length of time a given mobile terminal will operate in an active communications mode, before depleting its battery charge. Power amplifier efficiency is critical then to achieving competitive mobile terminal operating times.

The ratio of output RF power to input DC power establishes the power amplifier's efficiency rating. In general, the efficiency of a given power amplifier increases as the amplifier's output power moves upward through the linear amplification range, and efficiency reaches its maximum at a defined point in the amplifier's saturated mode of operation. While the power amplifier in a battery-powered device, such as a mobile terminal, would ideally operate in a saturated mode whenever it was actively transmitting, communication standards typically determine whether or not such operation is permissible. For example, the long-established Advanced-Mobile-Phone System (AMPS) standard defines a constant-envelope, frequency modulated transmission signal.

Absent the need to convey amplitude information, power amplifiers can operate in higher-efficiency saturated mode operation when transmitting within an AMPS system. Newer digital modulation standards, used in, for example, Enhanced Data through GSM Evolution (EDGE), employ techniques requiring some form of linear signal modulation. EDGE, for example, uses 8-ary Phase Shift Keying (PSK) modulation. These digital modulation standards are more spectrally efficient, e.g., they permit the transmission of more information within a given portion of radio frequency bandwidth. However, amplifier power efficiency suffers because of the need for linear amplification.

BRIEF SUMMARY OF THE INVENTION

The present invention provides a system and method for efficient, linear RF signal amplification. An RF power amplifier circuit configured for efficient, saturated mode operation includes a lossy modulator coupling the voltage supply terminal of the power amplifier to a supply voltage. The lossy modulator varies a series load between the supply voltage and the power amplifier's supply terminal as a function of an amplitude modulation signal. For a given amplifier supply current, the varying load modulates the supply voltage provided to the power amplifier in accordance with the amplitude modulation signal. This load modulation action imparts the desired amplitude modulation to the output signal of the power amplifier, even though the amplifier is configured for saturated mode operation. In this configuration, the power amplifier circuit exhibits both high efficiency and high linearity.

An RF signal that includes frequency or phase information in addition to amplitude information may be separated into first and second signal components. The first signal is at the desired transmit frequency and has a constant amplitude envelope, but includes the phase or frequency modulation information of the original RF signal to be amplified. The second signal is an amplitude modulation (AM) signal and represents the AM information in the original RF signal to be amplified. The power amplifier operating in an efficient saturated mode amplifies the first signal, while the second signal modulates the supply voltage provided to the power amplifier via of the lossy modulator. In this manner, the RF output signal from the power amplifier includes the phase or frequency and amplitude information of the original RF signal to be amplified.

The lossy modulator operates as a variable resistance, responsive to an amplitude modulation signal. The lossy modulator may be realized in both digital an analog form. In operation, the lossy modulator may advantageously provide a variable resistance ranging essentially from zero to infinite resistance. With the ability to operate down to essentially zero resistance, the lossy modulator allows the power amplifier to operate at voltages substantially equal to the supply voltage. The very low minimum on-resistance of the lossy modulator ensures that the maximum dynamic range of the RF output signal is not degraded.

DETAILED DESCRIPTION OF THE INVENTION

While the present invention contemplates usage within mobile terminals or other battery-powered RF communication devices where power amplifier efficiency and linearity are critical, it is applicable to a broad range of RF applications.

Figure 1:
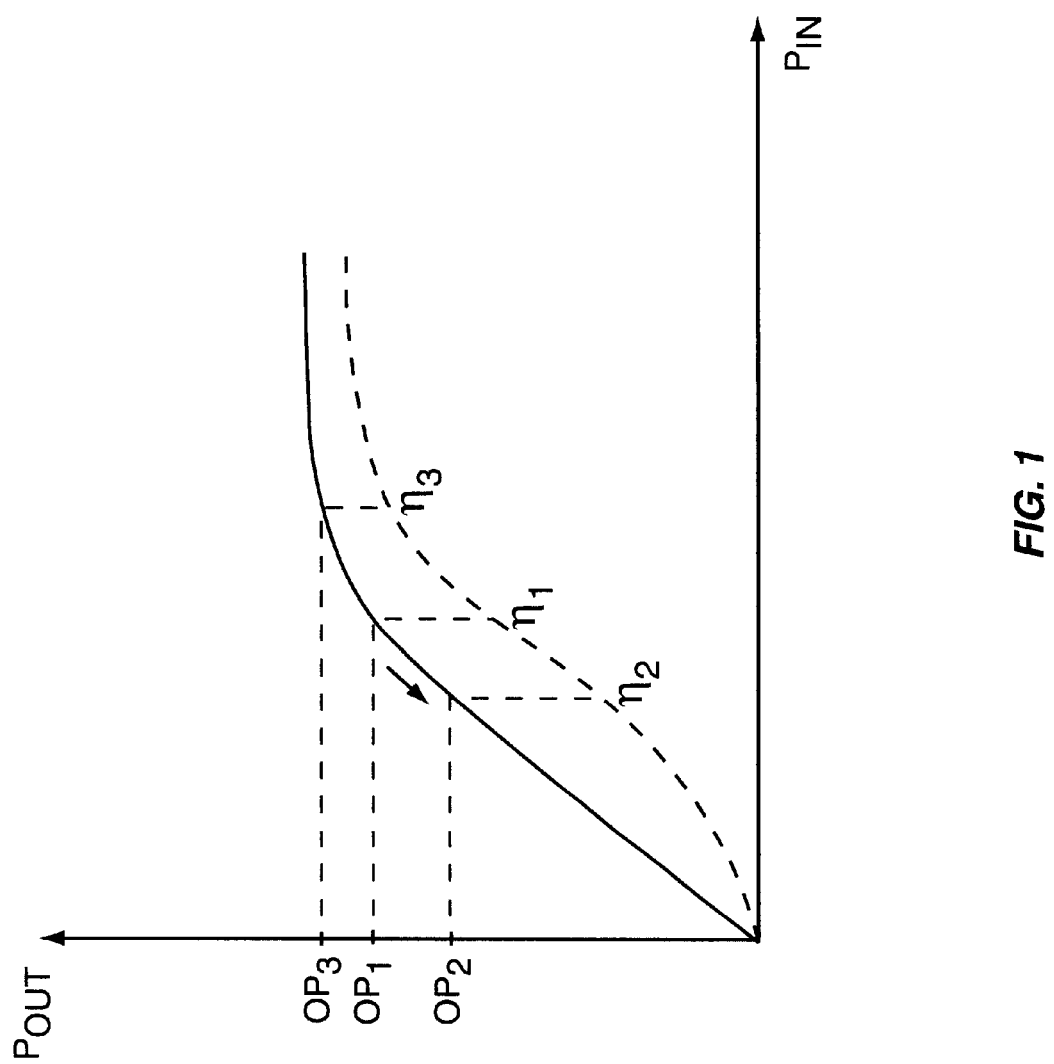
FIG. 1 is a graph of a typical RF power amplifier output power transfer curve and corresponding efficiency.

FIG. 1 depicts a general radio frequency output power curve for a typical power amplifier, and additionally illustrates the general relationship between the amplifier's operating point and its operating efficiency. The horizontal axis represents the RF power of the input signal $RF_{IN}$, while the vertical axis represents the RF power of the output signal $RF_{OUT}$ generated by a radio frequency power amplifier. Operating point 1 ($OP_1$) on the vertical axis illustrates a nominal operating point that might be chosen for linear operation of the power amplifier.

$OP_1$ corresponds to an amplifier operating efficiency $\eta_1$ in linear mode operation, which may have an exemplary value in the neighborhood of forty percent. The linearity requirements of some modulation standards, such as the 8-PSK techniques used in EDGE mobile terminals, are such that $OP_1$ may significantly degrade the spectral quality at the power amplifier output. Because of this, the power amplifier may be configured for operation at operating point 2 ($OP_2$), which provides greater range for linear amplification but results in significantly poorer efficiency. An exemplary efficiency value for $OP_2$ might be in the range of thirty percent.

Operating point 3 ($OP_3$) offers significantly improved efficiency as compared to $OP_1$ and $OP_2$, but requires that the power amplifier operate in a saturated mode, where the RF output power no longer varies linearly with the RF input power. As earlier noted, some signal modulation schemes do not require linear amplification, so operation at $OP_3$ presents no problems with regard to such signal modulation schemes. However, signal modulation schemes that require linear amplification are not amenable to amplification with conventional power amplifiers operating in saturated mode.

Figure 2:
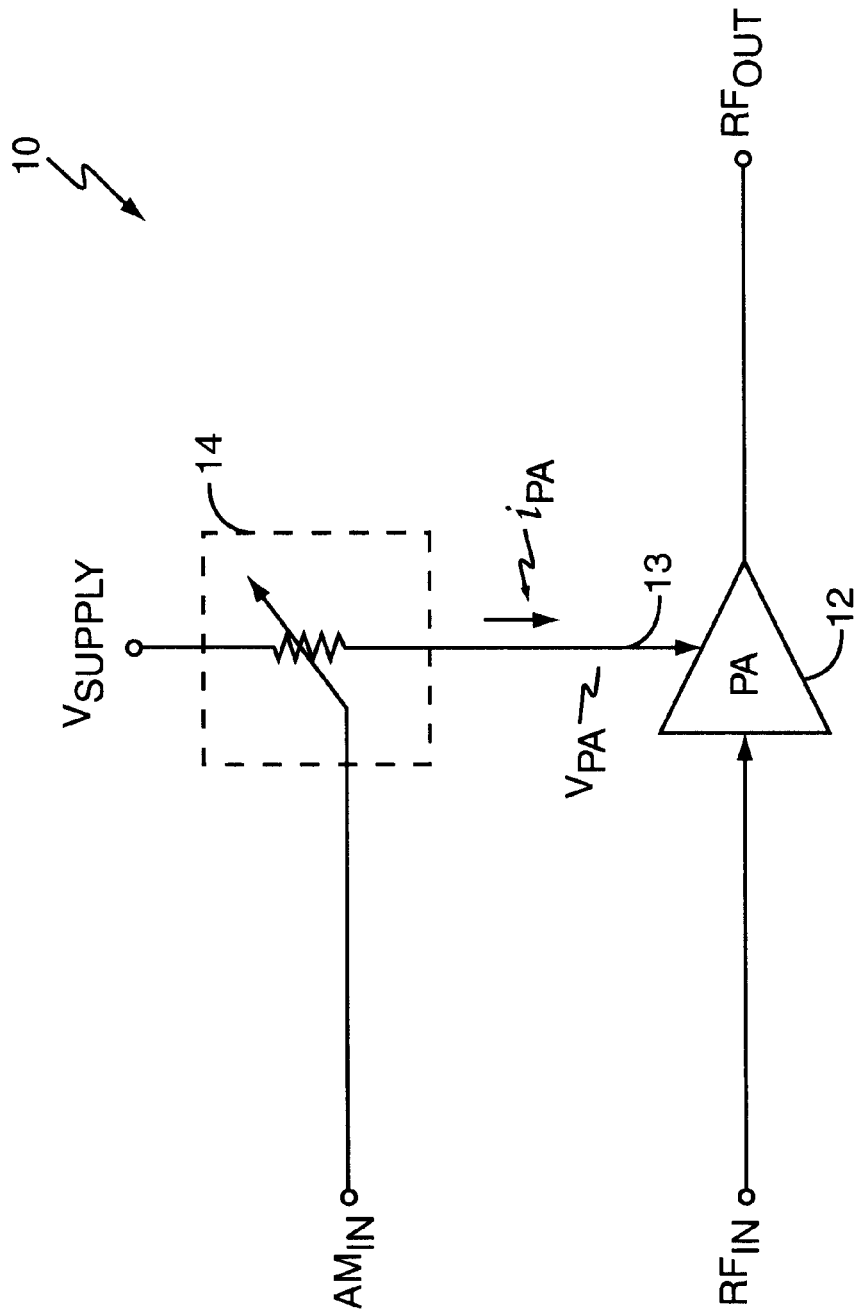
FIG. 2 is a functional diagram of a radio frequency power amplifier circuit in accordance with the present invention.

FIG. 2 depicts a simplified power amplifier circuit 10 in accordance with the present invention. The power amplifier circuit 10 includes a radio frequency power amplifier 12, and a lossy modulator 14. In operation, the RF power amplifier 12 is biased for saturated mode amplification of the RF input signal $RF_{IN}$. The lossy modulator 14 behaves as a variable resistance disposed in series between a supply voltage $V_{SUPPLY}$ and a supply voltage input 13 of the RF power amplifier 12. The term "lossy modulator" arises because the lossy modulator 14 controls output signal amplitude modulation through variable power dissipation. More specifically, the lossy modulator 14 operates as a resistive load that is varied to cause a desired voltage drop across the lossy modulator's resistive load based on an amplitude modulation control signal.

In operation, the RF power amplifier 12 operates in saturated mode and amplifies a constant envelope radio frequency input signal $RF_{IN}$ to produce the amplified radio frequency output signal $RF_{OUT}$. The signal amplitude of $RF_{OUT}$ is constrained by the operating voltage of the RF power amplifier 12. A supply voltage $V_{SUPPLY}$ is coupled to a supply input 13 of the RF power amplifier 12 through the lossy modulator 14. The lossy modulator 14 acts as a variable resistance responsive to an input amplitude modulation signal $AM_{IN}$. Because the power amplifier 12 draws its operating current through the lossy modulator 14, the effective series resistance of the lossy modulator 14 determines the operating voltage $V_{PA}$ of the power amplifier 12. Thus, in operation, the power amplifier operating voltage $V_{PA}$ is a function of the amplitude modulation signal $AM_{IN}$, with a maximum operating value defined by the minimum resistance of the lossy modulator 14 and the value of $V_{SUPPLY}$.

Figure 3:
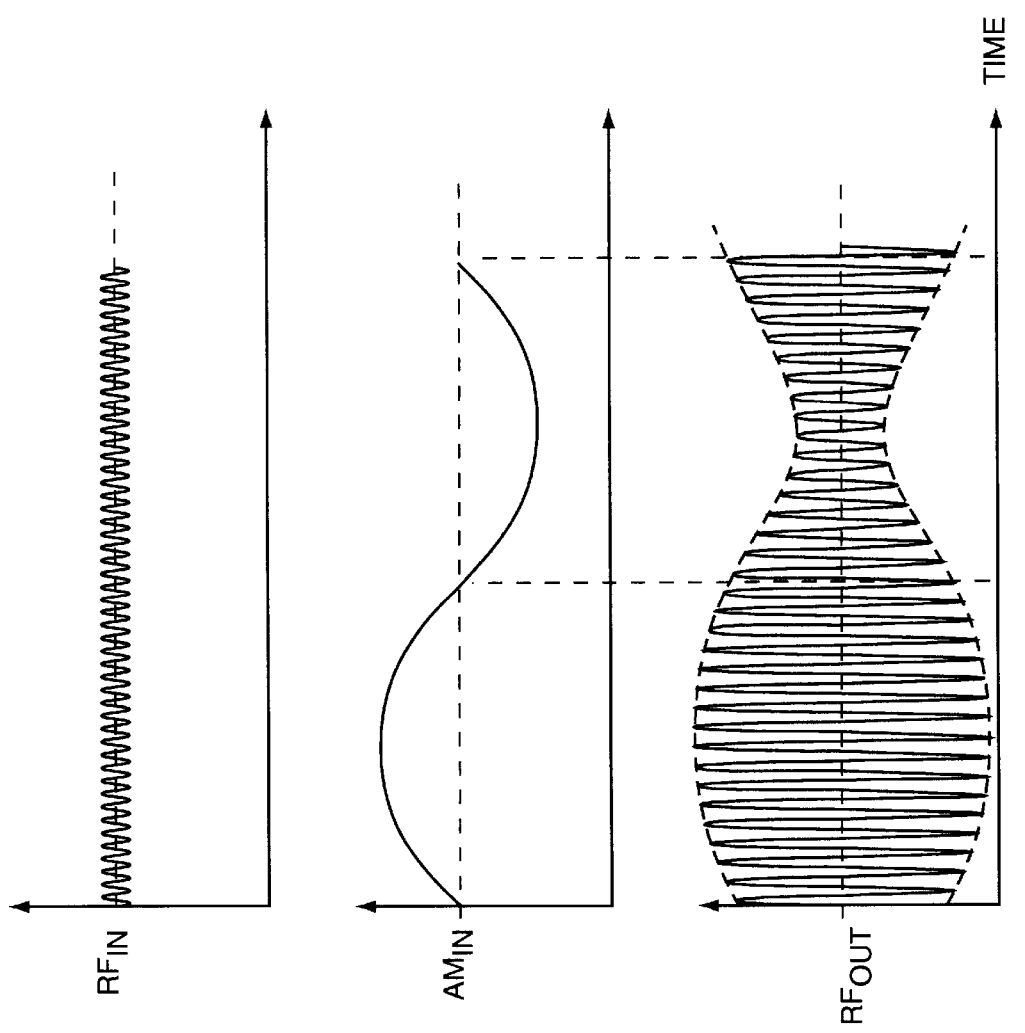
FIG. 3 is a graph of the radio frequency power amplifier circuit of FIG. 2 in operation.

FIG. 3 illustrates how the lossy modulator 14 impresses envelope modulation on the output signal $R_{FOUT}$ in accordance with the amplitude modulation input signal $AM_{IN}$. The upper graph shows an exemplary portion of the RF input signal $RF_{IN}$, the middle graph shows a time-aligned exemplary portion of the amplitude modulation (AM) waveform $AM_{IN}$, and the bottom graph shows a time-aligned exemplary portion of the RF output signal $RF_{OUT}$. The input signal $RF_{IN}$ has a constant envelope and contains, for example, phase- or frequency-modulated information. As the amplitude of the AM input signal $AM_{IN}$ increases, the amplitude of the RF output signal $RF_{OUT}$ increases. Conversely, as the amplitude of the AM input signal $AM_{IN}$ decreases, the amplitude of the RF output signal $RF_{OUT}$ decreases as well. By making the change in $RF_{OUT}$ linear with respect to the change in $AM_{IN}$, the AM input signal may be used to impress linear AM information in $RF_{OUT}$.

Figure 4:
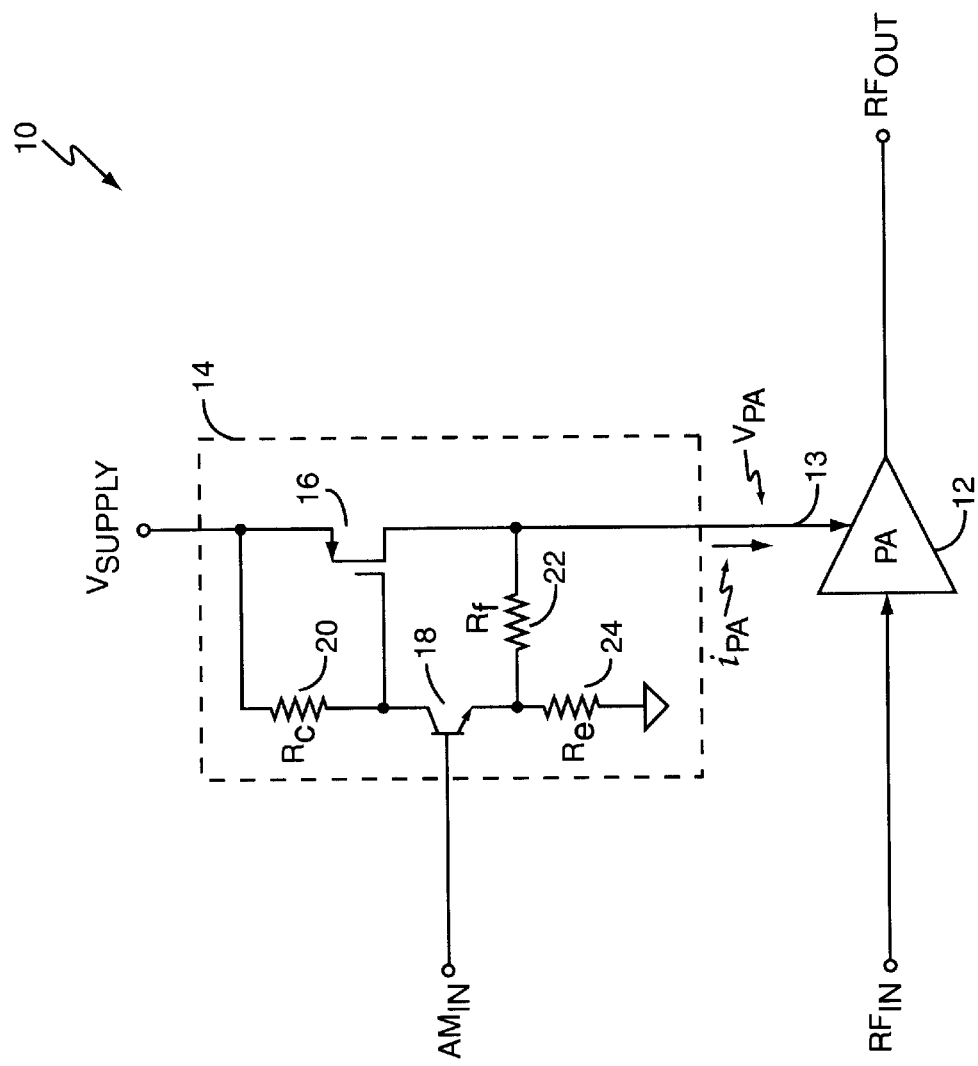
FIG. 4 is an exemplary analog embodiment of the lossy modulator in the power amplifier circuit of FIG. 2.

FIG. 4 is a diagram of an exemplary of the power amplifier circuit 10, including an analog implementation of the lossy modulator 14. The lossy modulator 14 includes a pass transistor 16, a control amplifier 18, a collector resistor ($R_C$) 20, a feedback resistor ($R_F$) 22, and an emitter resistor ($R_E$) 24. The control amplifier 18 can, for example be a bipolar junction transistor (BJT) configured for linear control of the pass transistor 16 based on the AM input signal $AM_{IN}$.

The control amplifier 18 is configured for operation in active mode, providing a collector current that varies linearly with the amplitude of the AM input signal $AM_{IN}$. The feedback and emitter resistors 22 and 24, respectively, set the gain of the control amplifier 18. In operation, the current through the collector resistor 20 increases linearly with an increasing amplitude of the AM input signal $AM_{IN}$. As the collector current increases, the voltage drop across the collector resistor 20 increases, thereby increasing the magnitude of the gate-to-source voltage ($V_{GS}$) of the pass transistor 16.

The pass transistor 16 functions as a variable resistance device. In this embodiment, the pass transistor 16 functions as a voltage-controlled variable resistance device, which can be, for example, be a Field Effect Transistor (FET). For the P-channel FET illustrated, the resistance between the source terminal coupled to the supply voltage $V_{SUPPLY}$ and the drain terminal coupled to the operating voltage input 13 of the power amplifier 12 varies as a function of the gate-to-source voltage $V_{GS}$. Thus, as the magnitude of $V_{GS}$ increases, the drain-to-source resistance ($R_{DS-ON}$) of the pass transistor 16 decreases. For a P-channel FET, VGS is negative, indicating that the gate voltage decreases with respect to the source voltage. The control amplifier controls the gate voltage of the pass transistor 16 by controlling the voltage drop across its collector resistor 20.

With modern FET devices, the minimum on-state drain-to-source resistance $R_{DS-ON}$ can be very low. For example, power-oriented P-FET devices achieve minimum $R_{DS-ON}$ values less than 30 milliohms. The ability of the pass transistor 16 to achieve such low on-state resistances provides substantial benefit to the power amplifier circuit 10. For example, amplification efficiency is oftentimes most critical in battery-powered communication devices that are inherently constrained in terms of supply voltages and available power. When maximum output signal swing is desired for $RF_{OUT}$, the pass transistor 16 of the lossy modulator 14 can be driven to a minimum on-state resistance value, such that the operating voltage $V_{PA}$ applied to the power amplifier 12 is substantially equal to the supply voltage $V_{SUPPLY}$.

As the operating voltage $V_{PA}$ constrains the signal amplitude of the RF output signal $RF_{OUT}$, the gain of the RF power amplifier 12 is a function of the operating voltage $V_{PA}$ applied to its operating voltage input 13. The voltage $V_{PA}$ is determined by the supply voltage $V_{SUPPLY}$, the gain of the lossy modulator 14, and on the instantaneous value of the AM input signal $AM_{IN}$.

The feedback resistor 22 and the emitter resistor 24 are connected in series from the supply voltage input 13 of the RF power amplifier 12, and thus form a voltage divider to ground. In this configuration, a fraction of the operating voltage $V_{PA}$ provided to the RF power amplifier 12 appears at the emitter of the control amplifier 18. As the AM input signal $AM_{IN}$ increases, the $R_{DS-ON}$ of the pass transistor decreases, and $V_{PA}$ increases. As $V_{PA}$ increases, the base-to-emitter voltage of the control amplifier 18 decreases. Feeding back the power amplifier operating voltage $V_{PA}$ in this manner keeps the control response of the control amplifier 18 linear with respect to the amplitude modulation signal $AM_{IN}$ and sets the gain of the lossy modulator 14.

Values for the feedback resistor 22, the emitter resistor 24, and the collector resistor 20, depend upon a given set of design requirements. In an exemplary configuration, the values of the feedback resistor 22 and emitter resistor 24 are sized such that the resistive voltage divider they form is relatively large compared to the effective impedance looking into the operating voltage input 13 of the power amplifier 12. For example, the feedback resistor 22 may be roughly 100 Ohms, while the emitter resistor 24 may be roughly 50 Ohms, depending upon the particular gain desired for the lossy modulator 14. The value of the collector resistor 20 need only be within a range of values such that the range of collector currents available with the control amplifier 18 generates an adequate control voltage range ($V_{GS}$) for the gate of the pass transistor 16. A value of roughly 200 Ohms is typical for the collector resistor 20.

Figure 5:
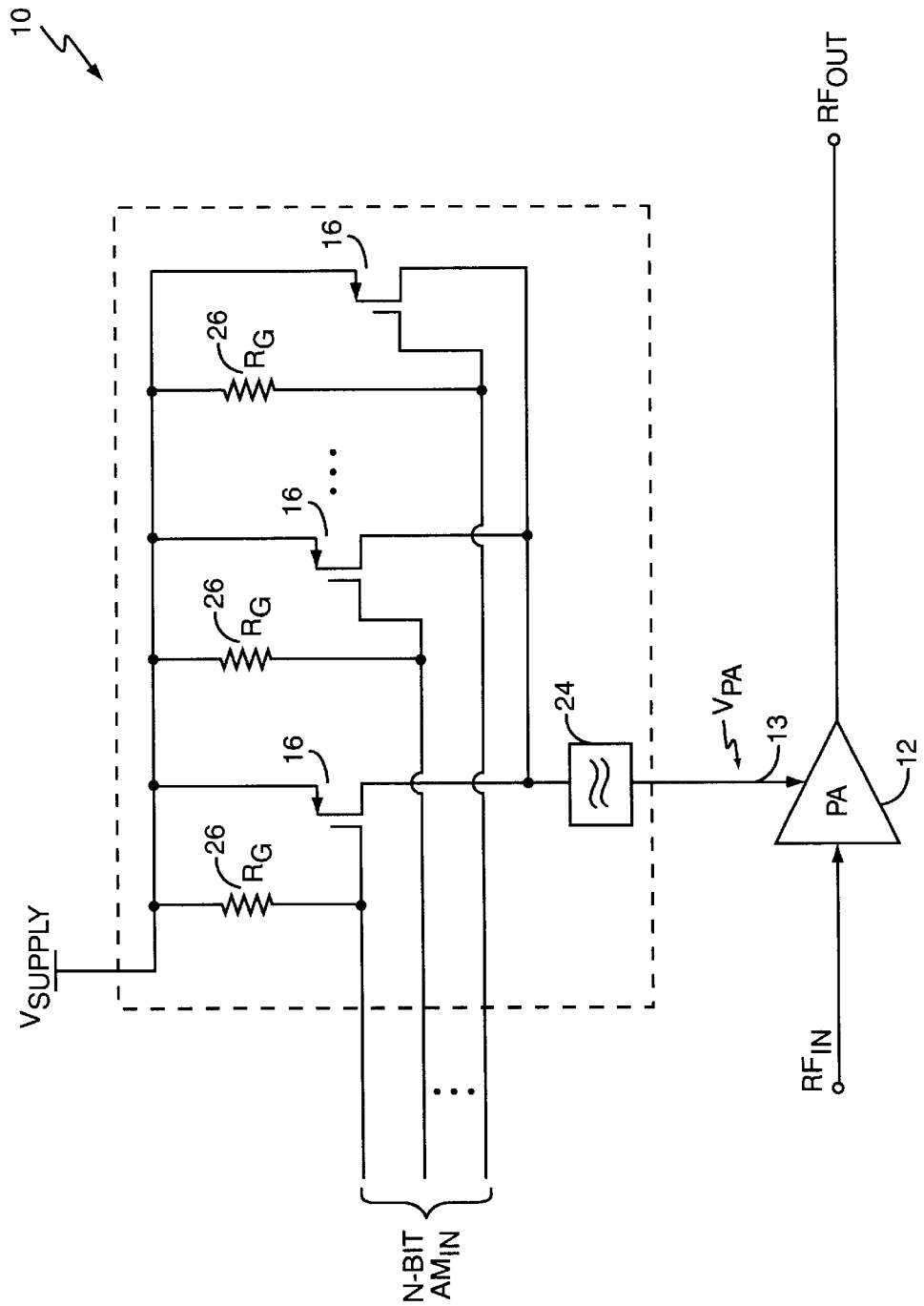
FIG. 5 is an exemplary digital embodiment of the lossy modulator in the power amplifier circuit of FIG. 2.

FIG. 5 is a diagram of an exemplary of the power amplifier circuit 10 including a digital implementation of the lossy modulator 14. The lossy modulator 14 includes multiple pass transistors 16, configured in parallel to connect the supply voltage $V_{SUPPLY}$ with a filter circuit 24. For convenience, the gate of each pass transistor 16 may be pulled to the supply voltage $V_{SUPPLY}$ via a pull-up resistor 26. The pull-up resistors 26 provide a convenient digital control interface for the digital I/O lines used to turn individual pass transistors 16 on and off. The various pass transistors 16 may be fabricated with specific $R_{DS-ON}$ values, such that the pass transistor 16 may be turned on and off in various binary combinations to achieve the desired value of the overall series resistance between the supply voltage $V_{SUPPLY}$ and the operating voltage input 13 of the RF power amplifier 12.

To create an effective series resistance that varies in proportion to the AM information desired for the RF output signal $RF_{OUT}$, the N-bit digital version of the $AM_{IN}$ signal assumes successive binary values that correspond to successive effective resistance values that impart the desired voltage drop across the set of parallel transistors 16. Thus, when it is desired to impress known AM information on the output signal $RF_{OUT}$, the digital $AM_{IN}$ signal takes on successive binary values corresponding to the AM information desired for the $RF_{OUT}$ signal.

The voltage drop across the parallel set of transistors 16 depends generally on how many parallel transistors 16 are turned on, and particularly on which specific ones of the parallel transistors 16 are turned on. Preferably, the parallel transistors 16 are individually operated as switches, assuming full on and full off states, rather than being operated in an analog fashion. Thus, the characteristic on-state resistance of each enabled parallel transistor 16 determines its contribution to the overall effective resistance of the plurality of transistors 16.

In the digital implementation, the AM input signal $AM_{IN}$ is an N-bit digital signal, where N corresponds to the number of parallel transistors 16. Because dynamically switching the various pass transistors 16 on and off may cause noise in the operating voltage $V_{PA}$, the filter circuit 24 is disposed between the operating voltage input 13 of the RF power amplifier 12 and the collection of parallel transistors 16. The filter circuit 24 filters out switching noise arising from turning the parallel set of pass transistors 16 on and off in different combinations. Depending upon its implementation, the filter circuit 24 may have a characteristic voltage drop proportionate to the current draw of the power amplifier 12. The binary values of the digital $AM_{IN}$ signal may be offset by a fixed amount to compensate for this, or feedback of the operating voltage output by the filter circuit 24 may be used to compensate the values of $AM_{IN}$.

As will be explained in more detail later, the frequency of the AM input signal $AM_{IN}$ is at a substantially lower frequency than the frequency of the RF input signal $RF_{IN}$. For example, in at least some anticipated applications, such as EDGE or Digital-AMPS (IS-136) modulation, the AM input signal $AM_{IN}$ is at or below 1 MHz. Therefore, the performance requirements for the circuit generating the digital $AM_{IN}$ signal are not significant, and the design of the filter node 24 is straightforward.

Figure 6:
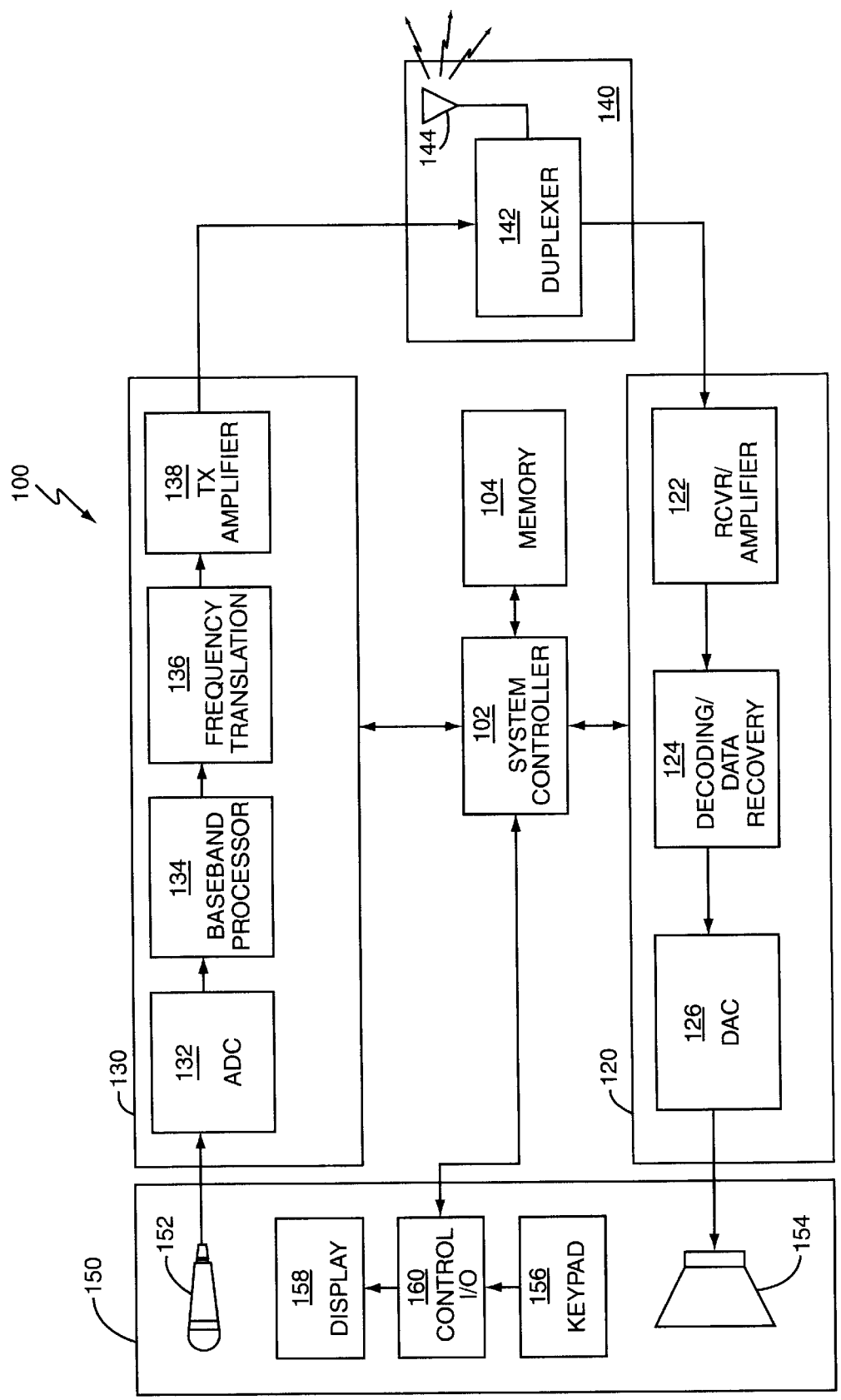
FIG. 6 is a simplified diagram of a mobile terminal incorporating the present invention.

While the present invention offers advantages to a variety of communication systems, it is a particular benefit to battery-powered wireless communication devices where operating efficiency is paramount. FIG. 6 is a simplified diagram of a typical mobile terminal used in a wireless communications network, such as a cellular radiotelephone network, and is generally indicated by numeral 100. The mobile terminal 100 includes a system controller 102 and associated memory 104, a receiver 120, a transmitter 130, a duplexer/antenna 140, and a user interface 150.

In operation, the mobile terminal 100 sends and receives information via radio frequency signaling between it and a remote base station (not shown). The system controller 102 is typically implemented as one or more microcontrollers (MCUs) that manage the user interface 150, and provide overall control of the mobile terminal 100. The memory 104 generally includes application software, default values for constants used in operation, and working space for data.

The user interacts with the mobile terminal 100 via the user interface 150. The microphone 152 converts user speech signals into a corresponding analog signal, which is provided to the transmitter 130 for subsequent conversion, processing, and transmission to the remote base station via the duplexer/antenna 140. The receiver 120 received signals from the remote base station and extracts received audio information, e.g., speech from a remote user, and provides an audio signal for driving a speaker 154 included in the user interface 150. The user interface 150 further includes a keypad 156 for accepting commands and data input from the user, and a display 158 for providing visual information to the user. In short, the user interface 150 allows the user to send and receive speech and other audio information, to dial numbers, and to enter other data as needed.

The receiver 120 includes a receiver/amplifier 122, a decoding/data recovery module 124, and a digital-to-analog converter (DAC) 126. In operation, signals are received via the antenna 144, and the duplexer 142 provides signal isolation between received and transmitted signals. Received signals are routed to the receiver amplifier 122, which provides conditioning, filtering, and down conversion of the received signal. In digital implementations, the receiver/amplifier 122 may use analog-to-digital converters (ADCs) to provide the decoding/data recovery module 124 with successive digital values corresponding to the incoming received signal. The decoding/data recovery module 124 recovers the audio information encoded in the received signal, and provides the DAC 126 with digital values corresponding to the received audio information. In turn, the DAC 126 provides an analog output signal suitable for driving the speaker 154.

The transmitter 130 includes an ADC 132, a baseband processor 134, a frequency translation module 136, and a transmit amplifier 138 configured in accordance with the present invention. In operation, the ADC 132 converts analog speech signals from the microphone 152 to corresponding digital values. The baseband processor 134 processes and encodes these digital values, providing error correction encoding and translation into a format suitable for frequency translation modulation in the frequency translation module 136. The frequency translation module 136 provides the transmit amplifier 138 with the constant envelope input signal $RF_{IN}$, and the baseband processor 134 provides it with the AM input signal $AM_{IN}$. In turn, the transmit amplifier 138 generates the RF output signal $RF_{OUT}$ for transmission to the remote base station via the duplexer/antenna 140.

Various techniques exist for generating separate amplitude modulation and phase modulation information for a given transmit signal modulation technique, based on the data to be transmitted. Exemplary patents illustrating such techniques in varying detail include: U.S. Pat. Nos. 5,847,602; 5,861,777; 6,049,703; 4,417,358; 5,777,519; 5,825,248; 5,886,572; 5,929,702; and 5,251,330, all of which are hereby incorporated by reference.

Figure 7:
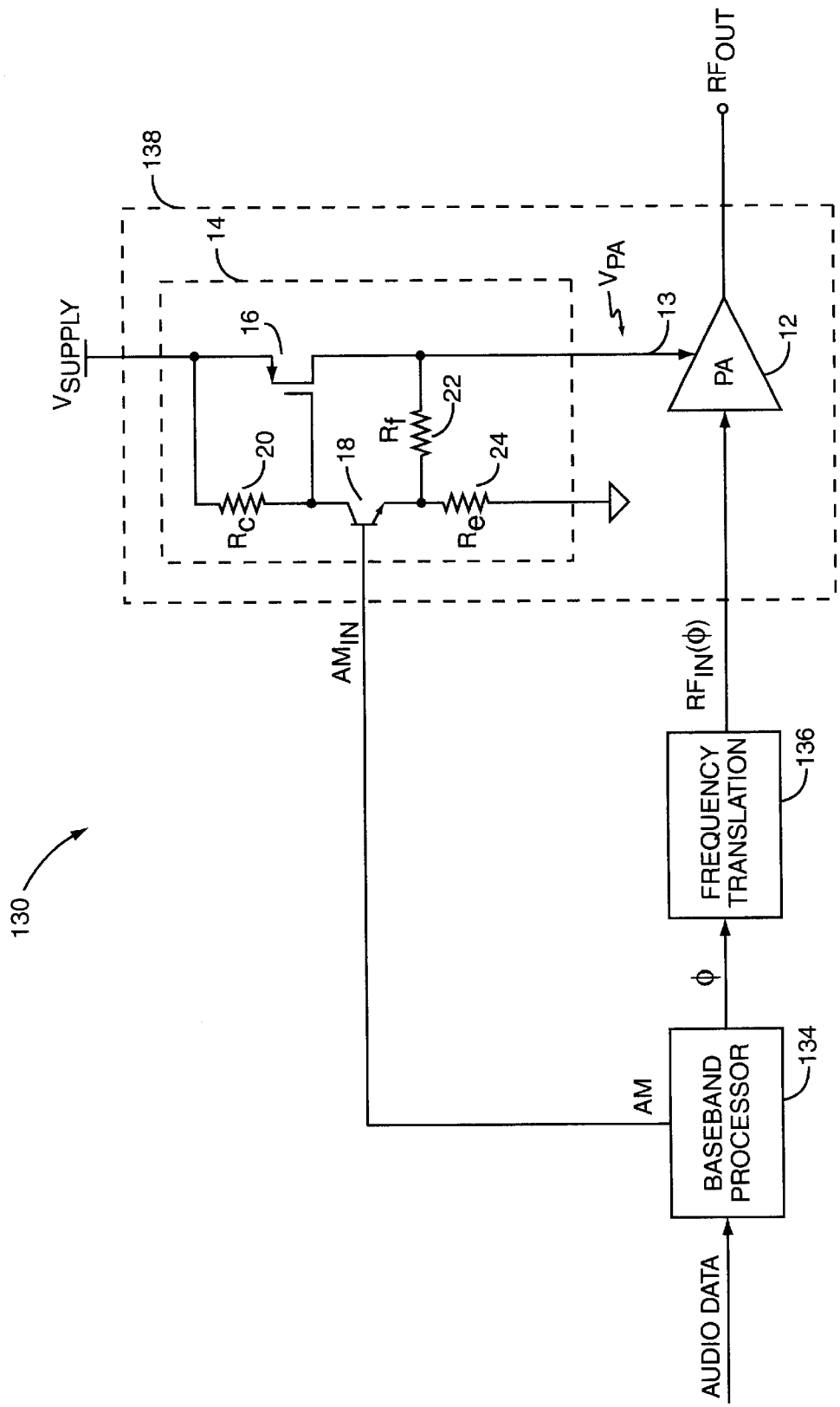
FIG. 7 is a diagram of the transmitter of FIG. 6 incorporating the lossy modulator circuit of FIG. 4.

FIG. 7 is a diagram of the transmitter 130 wherein the transmit amplifier 138 includes the power amplifier circuit 10 of FIG. 3. This configuration of the power amplifier circuit 10 includes an analog embodiment of the lossy modulator 14.

The baseband processor 134 receives audio data and processes this data to produce a constant envelope phase-modulated signal $\phi$ and the AM input signal $AM_{IN}$. The baseband processor 134 may be implemented as a digital signal processor (DSP), and may be shared between the receiver 120 and the transmitter 130 for digital processing functions associated with receive and transmit operations. Generation of the phase-modulated signal $\phi$ in combination with the AM input signal $AM_{IN}$ is desirable for modulation schemes such as M-ary PSK. Enhanced Data through GSM Evolution (EDGE) mobile terminals 100 may be utilize, for example, 8-PSK. These newer modulation standards require strict limitations on adjacent channel power, requiring adjacent channel power ratios of, for example, −56 dB at a 400 KHz offset. The transmit amplifier 138 must operate with good linearity to achieve these performance requirements.

The frequency translation module 136 translates the phase-modulated signal $\phi$ provided by the baseband processor 134 to the desired carrier frequency. Thus, the frequency translation module 136 provides the transmit amplifier 138 with the RF input signal $RF_{IN}$ that will be amplified by the RF power amplifier 12. As earlier noted, the AM input signal $AM_{IN}$ is typically at a lower frequency, 1 MHz for example, than the RF input signal $RF_{IN}$, which may be at 1.8 GHz for example. Operation of the transmit amplifier 138 is in accordance with earlier descriptions of the power amplifier circuit 10.

Figure 8:
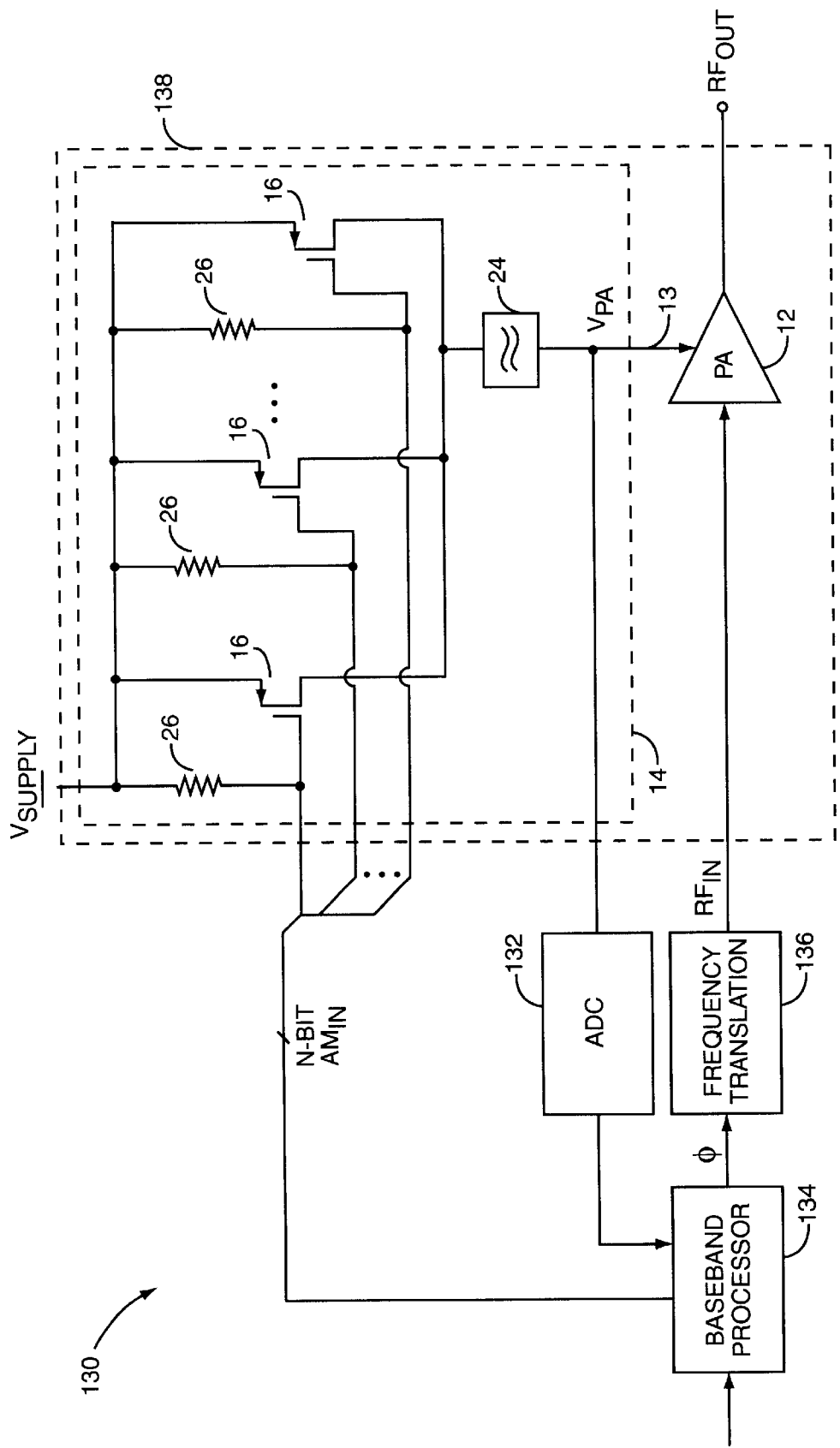
FIG. 8 is a diagram of the transmitter of FIG. 6 incorporating the lossy modulator circuit of FIG. 5.

FIG. 8 is a diagram of the transmitter 130 wherein the transmit amplifier 138 also includes the power amplifier circuit 10 of FIG. 7. However, this configuration of the power amplifier circuit 10 includes a digital embodiment of the lossy modulator 14. Operation of the transmitter 130 is essentially as explained above, but the baseband processor 134 generates the AM input signal $AM_{IN}$ as an N-bit digital signal, suitable for individually turning on and off the N parallel transistors 16 to vary the effective series resistance between the supply voltage $V_{SUPPLY}$ and the operating voltage input 13 of the power amplifier 12. Additionally, the ADC 132 is used to provide a feedback signal to the baseband processor 134. This allows the baseband processor 134 to provide closed-loop control of the voltage $V_{PA}$ as is provided for in the analog implementation of the lossy modulator 14.

This configuration assumes that the ADC 132 has at least one additional conversion channel available for use, as it also provides analog-to-digital conversion of the analog audio signal from the microphone 152. Of course, analog-to-digital conversion functions may be available elsewhere within the mobile terminal 100, or may be specifically provided for with the digital implementation of the lossy modulator 14 (see FIG. 5).

In operation, the baseband processor 134 determines the phase modulation signal $\phi$ and the digital $AM_{IN}$ signal in accordance with the desired phase and AM information desired for the transmit signal $RF_{OUT}$. More particularly, the baseband processor 134 determines the binary values of the digital $AM_{IN}$ signal to turn the collection of parallel transistors 16 on and off in varying combinations that correspond to desired effective resistance. The desired effective resistance corresponds to an effect voltage drop between the supply voltage $V_{SUPPLY}$ and the operating voltage input 13 of the power amplifier 12. Digitized feedback of the amplifier's operating voltage $V_{PA}$ through the ADC 132 permits the baseband processor 134 to make closed-loop adjustments of the $AM_{IN}$ signal to minimize errors in the operating voltage $V_{PA}$.

Note further that feeding back $V_{PA}$ permits the baseband processor 134 to "learn" the $R_{DS-ON}$ characteristics of each pass transistor 16. In this way, the baseband processor 134 can calibrate its control of the overall collection of parallel transistors 16 by observing the specific values of $V_{PA}$ corresponding to particular binary values of $AM_{IN}$. With feedback of the operating voltage $V_{PA}$, the baseband processor 134 might implement an overall calibration process that allows the mobile terminal 100 to generate a look-up table of desired operating voltage settings and corresponding binary values of the digital $AM_{IN}$ signal. Alternatively, the baseband processor 134, or some associated memory device, may be preprogrammed with specific $R_{DS-ON}$ values corresponding to each pass transistor 16. If reasonably precise resistance values are known with sufficient accuracy, the baseband processor 134 can control the operating voltage $V_{PA}$ using the set of parallel transistors 16 without need for closed-loop feedback. Open-loop control of the parallel transistors 16 might, in such configurations, be based on look-up table information corresponding to the known resistances of individual ones of the parallel transistors 16. In this case, the look-up table itself might simply be a listing of desired amplitude settings and corresponding binary values for the digital $AM_{IN}$ signal.

Figure 9:
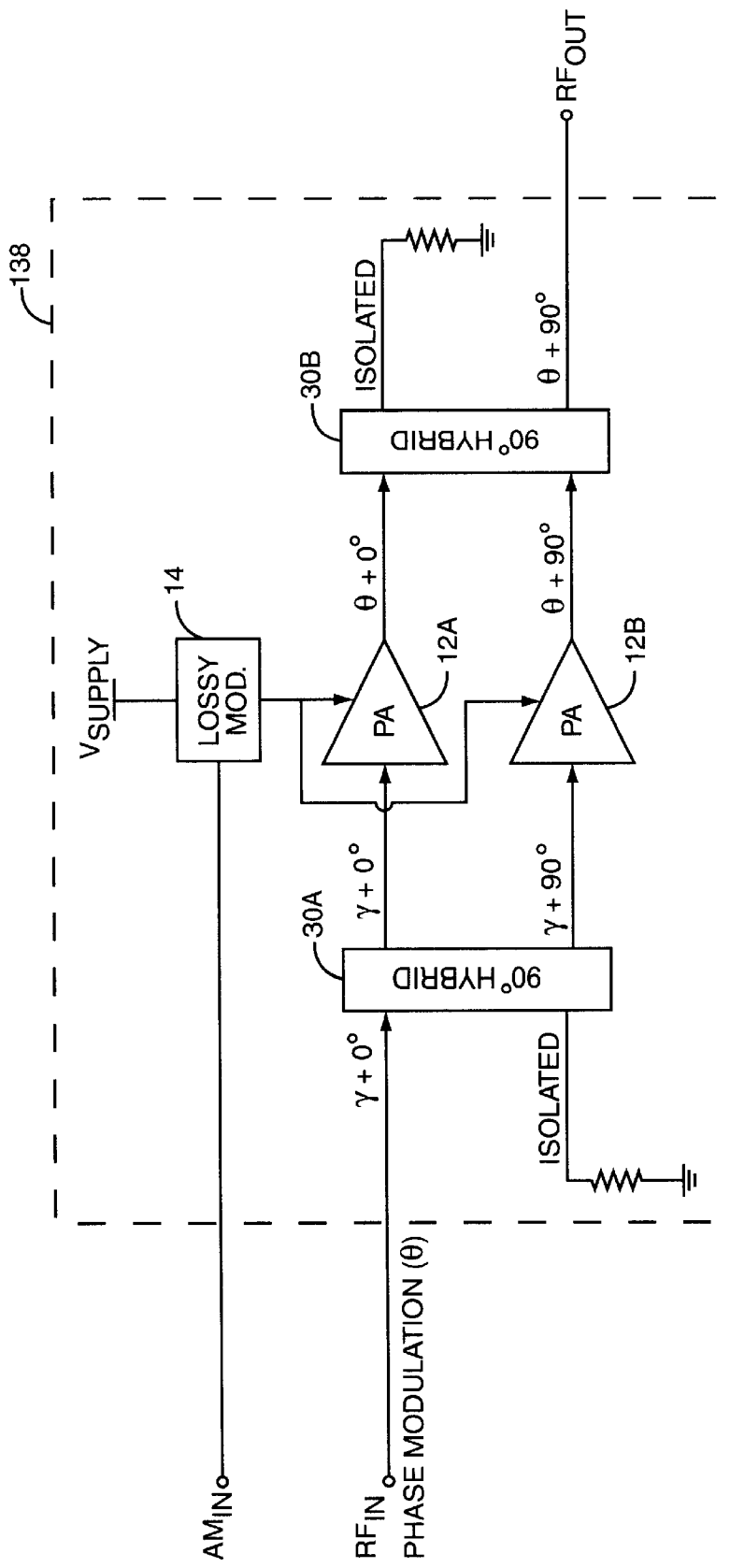
FIG. 9 is a diagram of a balanced amplifier implementation of the transmitter of FIG. 6.

FIG. 9 depicts a balanced amplifier approach, and includes two RF power amplifier 12A and 12B; each supplied a modulated operating voltage $V_{PA}$ by the lossy modulator 14. The balanced transmitter 138 further includes two hybrid couplers 30A and 30B. The couplers 30A and 30B may be hybrid or phase-shifted Wilkinson or lumped element combiners.

Operating with balanced amplifiers 12A and 12B may enhance cancellation of reflected power arising from mismatch at the external terminals of the transmitter 138. As earlier discussed, the base band processor 134 generates the phase-modulated signal and corresponding AM signal. The phase-modulated signal is modulated to the transmit frequency by the frequency translation module 136 and drives the coupler 30A as the $RF_{IN}$ signal. The coupler 30A drives the first RF power amplifier 12A with the $RF_{IN}$ signal, and drives the second RF power amplifier 12B with the $RF_{IN}$ signal shifted by 90°. The two $RF_{OUT}$ signals from the RF power amplifiers 12A and 12B drive the output coupler 30B, with a relative phase-shift of 90°. The final $RF_{OUT}$ signal to the duplexer/antenna 140 taken from the output of the coupler 30B.

The same AM signal may be used to modulate both RF power amplifiers 12A and 12B. Although the relative phase alignment of the amplitude and phase signals is important, at sufficiently high frequencies for the RF carrier of $RF_{IN}$, the amount of amplitude misalignment arising from use of the same AM signal on both amplifiers 12A and 12B is negligibly small. Indeed, the net result of using the same AM signal is virtual elimination of any amplitude mismatch in the output signals from the amplifiers 12A and 12B, resulting in enhanced cancellation and better stability.

The present invention may, of course, be carried out in other specific ways than those herein set forth with departing from the scope and essential characteristics of the invention. The present embodiments are therefore to be construed in all aspects as illustrative and not restrictive, and all changes coming within the meaning and equivalency of the appended claims are intended to be embraced herein.

What is claimed is:

1. A power amplifier circuit comprising:
   a power amplifier biased for saturated mode operation and operative to generate an RF output signal by amplifying a constant-envelope RF input signal; and
   a modulator comprising a resistive load for coupling an operating voltage input of said power amplifier to a supply voltage, said modulator operative to vary the resistance of said resistive load based on an amplitude modulation control signal.

2. The power amplifier circuit of claim 1 wherein said resistive load is a device is a voltage-controlled resistor.

3. The power amplifier circuit of claim 2 wherein said voltage-controlled resistor is a field-effect transistor.

4. The power amplifier circuit of claim 1 wherein said modulator comprises a variable resistance device operative as said resistive load.

5. The power amplifier circuit of claim 1 wherein said modulator comprises:
   an amplifier circuit operative to generate an analog control voltage based on said amplitude modulation control signal; and
   a pass transistor coupling said supply voltage to said operating voltage input of said power amplifier and operative as a variable resistance device responsive to said analog control voltage.

6. The power amplifier circuit of claim 1 wherein said resistive load comprises a pass transistor, and wherein said modulator further comprises a control circuit operative to control said pass transistor based on said amplitude modulation control signal.

7. The power amplifier circuit of claim 6 wherein said pass transistor comprises a field-effect transistor (FET).

8. The power amplifier circuit of claim 6 wherein said FET is a P-channel FET comprising:

a gate terminal coupled to said control circuit;
   a source terminal coupled to said supply voltage; and
   a drain terminal coupled to said operating voltage input of said power amplifier, said drain terminal providing an operating voltage to said power amplifier.

9. The power amplifier circuit of claim 8 wherein said control circuit comprises a transistor circuit comprising:
   a bipolar junction transistor (BJT) with a base terminal driven by said amplitude modulation control signal, a collector terminal coupled to said gate terminal of said P-channel FET, and an emitter terminal;
   a collector resistor coupling said collector terminal of said BJT and said gate terminal of said P-channel FET to said supply voltage;
   an emitter resistor coupling said emitter terminal of said BJT to a signal ground; and
   a feedback resistor coupling said drain terminal of said P-channel FET to said emitter terminal of said BJT, said feedback resistor and said emitter resistor forming a voltage divider for feeding back a portion of said operating voltage to said emitter terminal of said BJT.

10. The power amplifier circuit of claim 1 wherein said modulation control signal is a digital control signal, and further wherein said modulator comprises:
    a plurality of parallel transistors coupling said supply voltage to a filter circuit, said plurality of parallel transistors adapted to be turned on and off in varying combinations based on said digital control signal; and
    a filter circuit coupling said plurality of parallel transistors to said operating voltage input of said power amplifier, said filter circuit operative to generate an operating voltage for said power amplifier based on filtering an output voltage from said plurality of parallel transistors.

11. The power amplifier circuit of claim 10 further comprising a digital circuit operative to determine binary values of said digital control signal as a function of an amplitude modulation desired for said RF output signal.

12. The power amplifier circuit of claim 11 further comprising an analog-to-digital converter for feeding back digitized values of said operating voltage to said digital circuit, said digital circuit operative to adjust said binary values of said digital control signal based on said digitized values.

13. A balanced power amplifier circuit comprising:
    first and second power amplifiers operative to generate first and second RF output signals based on amplifying first and second RF input signals, respectively;
    a combiner operative to generate a combined RF output signal based on combining said first and second RF output signals; and
    a modulator comprising a resistive load for coupling operating voltage inputs of said first and second power amplifiers to a supply voltage, said modulator operative to vary the resistance of said resistive load based on an amplitude modulation control signal, thereby impressing desired amplitude modulation information in said first and second RF output signals.

14. A mobile terminal comprising:
    a transmitter operative to generate a transmit signal, said transmitter comprising:
      a power amplifier to generate a transmit signal based on amplifying an RF input signal, said power amplifier biased for saturated mode operation;
      a modulator comprising a resistive load coupling an operating voltage input of said power amplifier to a supply voltage, said modulator operative to impress amplitude modulation information in said transmit signal by varying said resistive load based on an amplitude modulation control signal.

15. The mobile terminal of claim 14 wherein said modulator further comprises a control circuit operative to vary said resistive load based on said amplitude modulation control signal.

16. The mobile terminal of claim 14 wherein said resistive load is a P-channel field-effect transistor (FET) with a source terminal coupled to said supply voltage, a drain terminal coupled to said operating voltage input of said power amplifier, and a gate terminal coupled to said control circuit to receive a load control signal, and further wherein said resistive load is a drain-to-source resistance of said P-channel FET.

17. The mobile terminal of claim 14 wherein said modulator further comprises a filter circuit coupling said resistive load to said operating voltage input of said power amplifier, and further wherein said resistive load comprises a plurality of parallel transistors responsive to a digital amplitude modulation control signal.

18. The mobile terminal of claim 17 further comprising a digital circuit to generate said digital amplitude modulation control signal such that binary values of said digital amplitude modulation control signal correspond to resistive load values required to effect desired amplitude modulation in said transmit signal.

19. The mobile terminal of claim 18 further comprising an analog-to-digital converter operative to feed back digitized values of an operating voltage provided to said power amplifier by said filter circuit, and wherein said digital circuit is operative to adjust said binary values to achieve said desired amplitude modulation based on said digitized values.

20. A method of generating an RF transmit signal comprising:
amplifying an RF input signal using a power amplifier biased for operation in saturation mode to generate an RF output signal; and
impressing amplitude modulation information on said RF output signal by varying a resistive load that couples a supply voltage to an operating voltage input of said power amplifier based on an amplitude modulation control signal.

21. The method of claim 20 wherein impressing amplitude modulation information on said RF output signal by varying said resistive load that couples said supply voltage to said operating voltage input of said power amplifier in accordance with said amplitude modulation control signal comprises controlling a pass transistor operative as said resistive load based on said amplitude modulation control signal.

22. The method of claim 21 wherein controlling said pass transistor operative as said resistive load based on said amplitude modulation control signal comprises controlling a gate voltage of a field-effect transistor (FET) configured as said pass transistor.

23. The method of claim 22 wherein said amplitude modulation control signal is an analog modulation signal, and further wherein controlling said gate voltage of a field-effect transistor (FET) configured as said pass transistor comprises generating said gate voltage proportional to said analog modulation signal.

24. The method of claim 23 further comprising driving a transistor amplifier circuit configured for linear operation with said analog modulation signal to generate said gate voltage.

25. The method of claim 24 further comprising feeding back a portion of an operating voltage provided by said pass transistor to said power amplifier to maintain linear operation of said transistor amplifier circuit.

26. The method of claim 20 further comprising operating said resistive load such that it has a minimum resistance when said amplitude modulation control signal corresponds to a maximum desired amplitude for said RF output signal, and wherein said minimum resistance is sufficiently low to permit an operating voltage provided by said resistive load to said power amplifier to substantially equal said supply voltage.

27. The method of claim 20 further comprising:
determining phase modulation and amplitude modulation information corresponding to transmit signal information desired for said RE output signal;
generating said RF input signal as a constant-envelope signal based on said phase modulation information; and
generating said amplitude modulation control signal based on said amplitude modulation information.

28. The method of claim 20 wherein said resistive load comprises a plurality of parallel transistors and further comprising generating said amplitude modulation control signal as a digital control signal operative to enable desired ones of said plurality of transistors.

29. The method of claim 28 further comprising filtering an operating voltage output by said plurality of transistors and provided to said operating voltage input of said power amplifier to filter out undesired voltage transients associated with dynamically switching various combinations of said plurality of transistors on and off based on said digital control signal.

30. The method of claim 28 further comprising:
determining amplitude modulation information desired for said RF output signal; and
generating said digital control signal such that binary values of said digital control signal correspond to amplitude modulation values desired for said RF output signal.

31. The method of claim 28 further comprising determining which ones of said plurality of transistors to turn on for a given desired amplitude of said RF output signal based on stored characteristic on-state resistance information associated with individual ones of said plurality of transistors.

32. The method of claim 28 further comprising:
converting an operating voltage provided to said power amplifier to digitized values; and
adjusting a binary value of said digital control signal based on said digitized values.

33. A method of generating a transmit signal using balanced power amplifiers, the method comprising:
generating a first signal with a constant envelope at a transmit frequency;
generating a second signal with desired amplitude modulation information;
applying said first signal with no relative phase shift to an input of a first power amplifier, and applying said first signal with a desired relative phase shift to an input of a second power amplifier;
controlling a magnitude of first and second transmit signals output by said first and second amplifiers based on varying a load resistance coupling operating voltage inputs of said first and second power amplifiers to a supply voltage in accordance with said second signal; and
combining said first and second transmit signals in an output combiner to form a combined transmit signal suitable for RF transmission.

* * * * *